(12) United States Patent
Kato et al.

(10) Patent No.: US 7,630,233 B2
(45) Date of Patent: Dec. 8, 2009

(54) SEMICONDUCTOR DEVICE AND DRIVING METHOD OF THE SAME

(75) Inventors: Kiyoshi Kato, Atsugi (JP); Yasuyuki Arai, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 203 days.

(21) Appl. No.: 10/593,576

(22) PCT Filed: Mar. 30, 2005

(86) PCT No.: PCT/JP2005/006713

§ 371 (c)(1),
(2), (4) Date: Sep. 20, 2006

(87) PCT Pub. No.: WO2005/096380

PCT Pub. Date: Oct. 13, 2005

(65) Prior Publication Data

US 2008/0123396 A1 May 29, 2008

(30) Foreign Application Priority Data

Apr. 2, 2004 (JP) ............................. 2004-110508

(51) Int. Cl.
*G11C 11/00* (2006.01)
(52) U.S. Cl. .................... 365/163; 365/148; 365/63; 365/145
(58) Field of Classification Search ............... 365/163, 365/148, 63, 145
See application file for complete search history.

(56) References Cited

U.S. PATENT DOCUMENTS 5,296,716 A * 3/1994 Ovshinsky et al. ............. 257/3

(Continued)

FOREIGN PATENT DOCUMENTS

CN        1155348        7/1997

(Continued)

OTHER PUBLICATIONS

International Search Report (Application No. PCT/JP2005/006713) dated Jul. 19, 2005.

(Continued)

*Primary Examiner*—Viet Q Nguyen
(74) *Attorney, Agent, or Firm*—Eric J. Robinson; Robinson Intellectual Property Law Office, P.C.

(57) ABSTRACT

The invention provides a semiconductor device including a memory of a simple structure to provide an inexpensive semiconductor device and a driving method thereof. The semiconductor device of the invention includes a phase change memory including a memory cell array having a plurality of memory cells, a control circuit that controls the phase change memory, and an antenna. The memory cell array includes a plurality of bit lines that extend in a first direction and word lines that extend in a second direction perpendicular to the first direction. Each of the plurality of memory cells includes a phase change layer provided between the bit lines and the word lines. In the semiconductor device having the aforementioned structure, one or both of a conductive layer that forms the bit lines and a conductive layer that forms the word lines transmits light.

23 Claims, 10 Drawing Sheets

U.S. PATENT DOCUMENTS

| | | | |
|---|---|---|---|
| 5,536,947 A * | 7/1996 | Klersy et al. | 257/3 |
| 5,604,003 A | 2/1997 | Coombs et al. | |
| 6,097,622 A * | 8/2000 | Shimizu et al. | 365/145 |
| 6,234,902 B1 * | 5/2001 | Hazama | 463/43 |
| 6,268,796 B1 * | 7/2001 | Gnadinger et al. | 340/572.5 |
| 6,312,979 B1 * | 11/2001 | Jang et al. | 438/166 |
| 6,462,984 B1 * | 10/2002 | Xu et al. | 365/175 |
| 6,487,113 B1 * | 11/2002 | Park et al. | 365/163 |
| 6,493,275 B2 * | 12/2002 | Tomita | 365/189.09 |
| 6,590,807 B2 * | 7/2003 | Lowrey | 365/175 |
| 6,727,862 B2 * | 4/2004 | Tomon | 343/895 |
| 6,795,338 B2 * | 9/2004 | Parkinson et al. | 365/163 |
| 6,816,380 B2 * | 11/2004 | Credelle et al. | 361/736 |
| 6,831,856 B2 * | 12/2004 | Pashmakov | 365/163 |
| 6,987,496 B2 * | 1/2006 | Koyama et al. | 345/76 |
| 7,019,391 B2 * | 3/2006 | Tran | 257/678 |
| 7,031,182 B2 * | 4/2006 | Beigel et al. | 365/149 |
| 7,081,819 B2 * | 7/2006 | Martinez de Velasco Cortina et al. | 340/572.7 |
| 7,099,180 B1 * | 8/2006 | Dodge et al. | 365/148 |
| 7,154,774 B2 * | 12/2006 | Bedeschi et al. | 365/163 |
| 7,205,562 B2 * | 4/2007 | Wicker | 257/2 |
| 7,214,569 B2 * | 5/2007 | Swindlehurst et al. | 438/125 |
| 7,220,985 B2 * | 5/2007 | Cheung et al. | 257/40 |
| 7,423,539 B2 * | 9/2008 | Hyde et al. | 340/572.4 |
| 2003/0183699 A1 | 10/2003 | Masui | |
| 2004/0164302 A1 | 8/2004 | Arai et al. | |
| 2005/0210302 A1 | 9/2005 | Kato et al. | |

FOREIGN PATENT DOCUMENTS

| | | |
|---|---|---|
| JP | 01-132158 | 5/1989 |
| JP | 2003-229538 | 8/2003 |
| WO | WO 96/000441 | 1/1996 |

OTHER PUBLICATIONS

Written Opinion (Application No. PCT/JP2005/006713) dated Jul. 19, 2005.

Nikkei Electronics "Wave of the Fusion of Different Areas to Phase Change Film, Organic, and AFM Memory," Jan. 19, 2004, pp. 63-72.

Ohsaka et al., "6. Phase-Change Optical Disk," Record-Memory Material Handbook, Nov. 20, 2000, pp. 252-255.

Office Action (Application No. 200580010159.0) Dated Apr. 4, 2008.

* cited by examiner

SEMICONDUCTOR DEVICE AND DRIVING METHOD OF THE SAME

TECHNICAL FIELD

The present invention relates to a semiconductor device capable of transmitting and receiving data and a driving method thereof.

BACKGROUND ART

In recent years, a semiconductor device that transmits and receives data using electromagnetic waves without contact has been developed. Such a semiconductor device is called an RF (Radio Frequency) tag, a wireless tag, an electronic tag, a transponder and the like. Most semiconductor devices currently in practical use have circuits each using a semiconductor substrate (also referred to as an IC (Integrated Circuit) chip) and an antenna. The IC chip is incorporated with a memory and a control circuit.

DISCLOSURE OF INVENTION

Although a semiconductor device that can transmit and receive data without contact is used for some railway passes and electronic money cards, it has been a prime task to provide an inexpensive semiconductor device for further popularization. In view of the aforementioned, the invention provides a semiconductor device including a memory of simple structure for providing an inexpensive semiconductor device and a driving method thereof.

The semiconductor device of the invention includes a phase change memory including a memory cell array having a plurality of memory cells, a control circuit for controlling the phase change memory, and an antenna. The memory cell array includes a plurality of bit lines that extend in a first direction and word lines that extend in a second direction perpendicular to the first direction. Each of the plurality of memory cells includes a phase change layer provided between the bit line and the word line. One or both of a conductive layer that forms the bit lines and a conductive layer that forms the word lines transmits light in the semiconductor device having the aforementioned structure.

The phase change layer comprises a material that changes reversibly between a crystalline state and an amorphous state. For example, the material contains one or a plurality of elements selected from germanium (Ge), tellurium (Te), antimony (Sb), sulfur (S), tellurium oxide (TeO$_x$), tin (Sn), gold (Au), gallium (Ga), selenium (Se), indium (In), thallium (Tl), cobalt (Co), and silver (Ag).

The phase change layer comprises a material that changes reversibly between a first crystalline state and a second crystalline state. For example, the material contains one or a plurality of elements selected from silver (Ag), zinc (Zn), copper (Cu), aluminum (Al), nickel (Ni), indium (In), antimony (Sb), selenium (Se), and tellurium (Te).

The phase change layer comprises a material that changes only from an amorphous state to a crystalline state. For example, the material contains one or a plurality of elements selected from tellurium (Te), tellurium oxide (TeO$_x$), palladium (Pd), antimony (Sb), selenium (Se), and bismuth (Bi).

The semiconductor device of the invention includes one or a plurality of memories selected from a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory.

The semiconductor device of the invention includes one or a plurality of circuits selected from a power supply circuit, a clock generating circuit, a data demodulation/modulation circuit, and an interface circuit.

In the semiconductor device having the aforementioned structure, the phase change memory and the control circuit are provided over a glass substrate. Moreover, the phase change memory and the control circuit are provided on a flexible substrate. The control circuit includes a thin film transistor.

A driving method of the semiconductor device having the aforementioned structure is such that a phase of the phase change layer is changed by applying a voltage between the bit lines and the word lines to write data, and a phase state of the phase change layer is read by applying a voltage between the bit lines and the word lines to read data.

Alternatively, data is written by changing the phase of the phase change layer by irradiating light through the first conductive layer or the second conductive layer, while data is read by reading the phase state of the phase change layer by applying a voltage between the bit lines and the word lines.

According to the invention having the aforementioned structure, by providing a semiconductor device including a phase change memory of a simple structure, an inexpensive semiconductor device and a driving method thereof can be provided.

Although the present invention will be fully described by way of Embodiment Modes and Embodiments with reference to the accompanying drawings, it is to be understood that various changes and modifications will be apparent to those skilled in the art. Therefore, unless otherwise such changes and modifications depart from the scope of the invention, they should be construed as being included therein. Note that identical portions in embodiment modes are denoted by the same reference numerals and detailed descriptions thereof are omitted.

A semiconductor device 20 of the invention has a function to communicate data without contact and includes a power supply circuit 11, a clock generating circuit 12, a data demodulation/modulation circuit 13, a control circuit 14 for controlling other circuits, an interface circuit 15, a memory 16, a data bus 17, and an antenna (antenna coil) 18 (see FIG. 1A). The power supply circuit 11 generates various power to be supplied to each circuit in the semiconductor device based on an AC electrical signal inputted from the antenna 18. The clock generating circuit 12 generates various clock signals to be supplied to each circuit in the semiconductor device based on the AC electrical signal inputted from the antenna 18. The data demodulation/modulation circuit 13 has a function to demodulate/modulate data to communicate with a reader/writer 19. The control circuit 14 has a function to control the phase change memory 16. The antenna 18 has a function to transmit and receive electromagnetic waves. Specifically, the antenna 18 transforms electromagnetic waves into AC electrical signals. Also, the antenna is added load modulation by the data demodulation/modulation circuit 13. The reader/writer 19 controls the process regarding communication and control of the semiconductor device, and data thereof. Note that the semiconductor device is not limited to the aforementioned structure and may be additionally provided with other elements such as a limiter circuit of a power supply voltage and a decoding hardware.

The memory 16 includes a phase change memory. The memory 16 may include only a phase change memory as well as a memory having other structures. The phase change memory utilizes a phase change of a recording thin film. The phase change of the recording thin film is generated by optical (optical action) or electrical action.

The memories having other structures provided other than the phase change memory are, for example, one or a plurality of a DRAM, an SRAM, an FeRAM, a mask ROM, a PROM, an EPROM, an EEPROM, and a flash memory.

Next, a structure of the phase change memory is described (see FIG. 1B). The phase change memory includes a memory cell array 22 in which memory cells 21 are provided in matrix, decoders 23 and 24, a selector 25, and a read/write circuit 26.

The memory cell 21 includes a first conductive layer that forms a bit line Bx (1=x=m), a second conductive layer that forms a word line Wy (1=y=n), and a phase change layer. The phase change layer is provided between the first conductive layer and the second conductive layer. In FIG. 1B, a stack of the first conductive layer, the second conductive layer, and the phase change layer is denoted by a circuit symbol representing a resistor.

Next, a top structure and a sectional structure of the memory cell array 22 are described (see FIGS. 2A and 2B). The memory cell array 22 includes a first conductive layer 27 that extends in a first direction, a second conductive layer 28 that extends in a second direction perpendicular to the first direction, and a phase change layer 29. The first conductive layer 27 and the second conductive layer 28 are formed so as to cross each other in stripe. An insulating layer 33 is provided between adjacent phase change layers 29. An insulating layer 34 that functions as a protective layer is provided so as to be in contact with the second conductive layer 28.

A substrate 30 is formed of a glass substrate, a flexible substrate, a quartz substrate, a silicon substrate, a metal substrate, a stainless substrate, or the like. The flexible substrate is a substrate that can be bent flexibly, such as a plastic substrate formed of polycarbonate, polyarylate, and polyether sulfone. The first conductive layer 27 and the second conductive layer 28 are formed using a known conductive material such as aluminum (Al), copper (Cu), and silver (Ag).

In the case of writing data optically, one or both of the first conductive layer 27 and the second conductive layer 28 transmits light. A conductive layer that transmits light is formed using a transparent conductive material such as indium tin oxide (ITO) or formed thin enough to transmit light when using a conductive material that is not transparent.

The phase change layer 29 is formed of a material that changes reversibly between a crystalline state and an amorphous state. Alternatively, the phase change layer 29 is formed of a material that changes reversibly between a first crystalline state and a second crystalline state. Otherwise, the phase change layer 29 is formed of a material that changes only from an amorphous state to a crystalline state. When using a reversible material, data can be read and written. When using an irreversible material, on the other hand, data can only be read. In this manner, the phase change memory can serve as a read only memory or a read/write memory depending on the kind of material. Therefore, the material for the phase change layer 29 is to be appropriately selected according to the application of the semiconductor device.

The material that changes reversibly between a crystalline state and an amorphous state is a material containing a plurality of elements selected from germanium (Ge), tellurium (Te), antimony (Sb), sulfur (S), tellurium oxide (TeO$_x$), tin (Sn), gold (Au), gallium (Ga), selenium (Se), indium (In), thallium (Tl), cobalt (Co), and silver (Ag), which is a material based on, for example, Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, and Ag—In—Sb—Te.

In the above description of the materials, for example, Ge—Te—Sb—S means a material containing four elements: germanium (Ge), tellurium (Te), antimony (Sb), and sulfur (S) and a composition ratio of these four materials is not particularly restricted. Also, Ge—Te—Sb—S is sometimes referred to as a Ge—Te—Sb—S-based material or a germanium-tellurium-antimony-sulfur-based material.

The material that changes reversibly between the first crystalline state and the second crystalline state is a material containing a plurality selected from silver (Ag), zinc (Zn), copper (Cu), aluminum (Al), nickel (Ni), indium (In), antimony (Sb), selenium (Se), and tellurium (Te), which is for example, Ag—Zn, Cu—Al—Ni, In—Sb, In—Sb—Se, and In—Sb—Te. In the case of such material, a phase changes between two different crystalline states.

The material that changes only from an amorphous state to a crystalline state is a material containing a plurality of elements selected from tellurium (Te), tellurium oxide (TeO$_x$), palladium (Pd), antimony (Sb), selenium (Se), and bismuth (Bi), which is specifically a material containing a plurality selected from tellurium (Te), tellurium oxide (TeO$_x$), palladium (Pd), antimony selenium (Sb$_x$Se$_y$), and bismuth tellurium (Bi$_x$Te$_y$). For example, Te—TeO$_2$, Te—TeO$_2$-Pd, Sb$_2$Se$_3$/Bi$_2$Te$_3$ can be employed.

In the above description of the materials, Sb$_2$Se$_3$/Bi$_2$Te$_3$ means that a layer containing Sb$_2$Se$_3$ and a layer containing Bi$_2$Te$_3$ are stacked.

As a different structure than the aforementioned, a rectifying element may be provided between the first conductive layer 27 and the phase change layer 29 (see FIG. 2D). The rectifying element means a transistor of which gate electrode and a drain electrode are connected, or a diode. Here, a PN junction diode including semiconductor layers 44 and 45 is provided. One of the semiconductor layers 44 and 45 is an N-type semiconductor while the other is a P-type semiconductor. In this manner, by providing a rectifying diode, a current flows only in one direction, thus errors are reduced and a reading margin is improved. When providing a diode, a diode having other structures such as a PIN junction diode and an avalanche diode may be used as well as a PN junction diode.

As described above, the phase change memory has a simple structure where a phase change layer is provided between a pair of conductive layers. Therefore, forming steps thereof are simple, which can provide an inexpensive semiconductor device. Also, the phase change memory is a nonvolatile memory, thus a battery for storing data is not required to be incorporated and a semiconductor device which is compact, thin, and lightweight can be provided. Moreover, by using an irreversible material for the phase change layer 29, data cannot be reprogrammed. Accordingly, a forgery can be prevented and a semiconductor device with ensured security can be provided.

Next, an operation of writing data to the phase change memory is described. Data writing is performed optically or electrically. First, description is made on the electrical data writing (see FIG. 1B). In this case, one memory cell 21 is selected by the decoders 23, 24 and the selector 25, and then data is written to the memory cell 21 using the read/write circuit 26. In specific, a voltage is applied between the first conductive layer 27 and the second conductive layer 28 to change the phase of the phase change layer 29, thus data is written.

Next, description is made on the optical data writing (see FIGS. 2B and 2C). In this case, the phase change layer 29 is irradiated with laser light using a laser light irradiating means 32 from a conductive layer side that transmits light (the second conductive layer 28 here). Irradiated with laser light, the phase change layer 29 changes its phase crystallographicly. In this manner, data is written by utilizing the phase change of the phase change layer 29 by irradiation of laser light.

When writing data of "1", for example, the phase change layer 29 is irradiated with laser light to be heated to a crystallizing temperature or higher, and then slowly cooled to be crystallized. When writing data of "0", on the other hand, the phase change layer 29 is irradiated with laser light to be heated to a fusing point or higher to be fused, and then rapidly quenched to obtain an amorphous state.

The phase change of the phase change layer 29 is achieved by irradiation of laser light of which diameter is in an order of μm, depending on the size of the memory cell 21. For example, when a laser beam of which diameter is 1 μm passes through at a speed of 10 m/sec, a phase change layer included in one memory cell 21 is irradiated with laser light for 100 nsec. In order to change the phase in a time as short as 100 nsec, a laser power is preferably set 10 mW and a power density is preferably set 10 kW/mm$^2$.

Irradiation of laser light to the phase change layer 29 may be performed to all the memory cells 21 or selectively. In the case where the phase change layer 29 that is formed shortly before is in an amorphous state, for example, it is not irradiated with laser light for keeping the amorphous state while it is irradiated with laser light for changing into the crystalline state (see FIG. 2C). That is to say, data may be written by selective irradiation of laser light as well. In this manner, when selectively irradiating laser light, it is preferable to use a pulsed oscillation laser irradiation apparatus.

As described above, according to the structure of the invention that data is written by laser light irradiation, a semiconductor device can be easily manufactured at a large quantity. Therefore, an inexpensive semiconductor device can be provided.

Next, an operation of reading data of the phase change memory is described (see FIGS. 1B and 9). Here, the read/write circuit 26 includes a resistor 46 and a sense amplifier 47. However, the structure of the read/write circuit 26 is not limited to the aforementioned one and may have any structures.

Data reading is performed by reading the phase state of the phase change layer 29 by applying a voltage between the first conductive layer 27 and the second conductive layer 28. In specific, a resistance value Ra of the phase change layer 29 in an amorphous state and a resistance value Rb of the phase change layer 29 in a crystalline state satisfy Ra>Rb. By reading such a difference between the resistance values electrically, data is read. For example, when reading data of the memory cell 21 disposed in x-th column of y-th row among the plurality of memory cells 21 included in the memory cell array 22, a bit line Bx of the x-th column and a word line Wy of the y-th row are selected by the decoders 23, 24, and the selector 25.

Then, the phase change layer included in the memory cell 21 and the resistor 46 are connected in series. In this manner, when a voltage is applied to both ends of the two resistors connected in series, the potential of a node a becomes a potential obtained by resistance division according to the resistance value Ra or Rb of the phase change layer 29. The potential of the node a is supplied to the sense amplifier 47 which then determines which data is included, "0" or "1".

After that, a signal including data of "0" or "1" determined by the sense amplifier 47 is outputted.

According to the aforementioned method, the phase state of the phase change layer 29 is read by a voltage value by utilizing a resistor division and a difference between the resistor values. However, current values may be compared as well by utilizing that a current value Ia of the phase change layer 29 in an amorphous state and a current value Ib of the phase change layer 29 in a crystalline state satisfy Ia>Ib.

BEST MODE FOR CARRYING OUT THE INVENTION

Embodiment 1

Figure 1A:
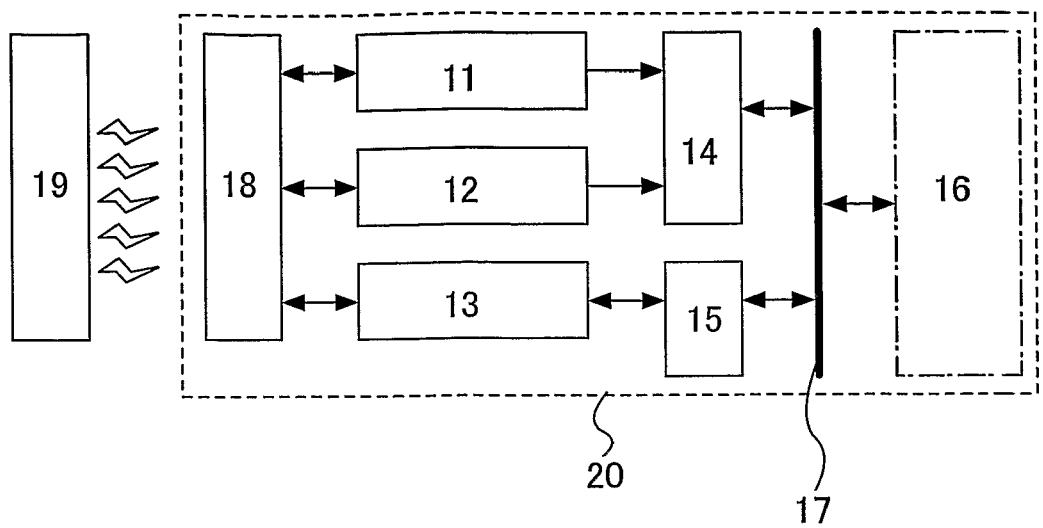
FIGS. 1A and 1B are diagrams showing the semiconductor device of the invention and a driving method thereof.
Figure 1B:
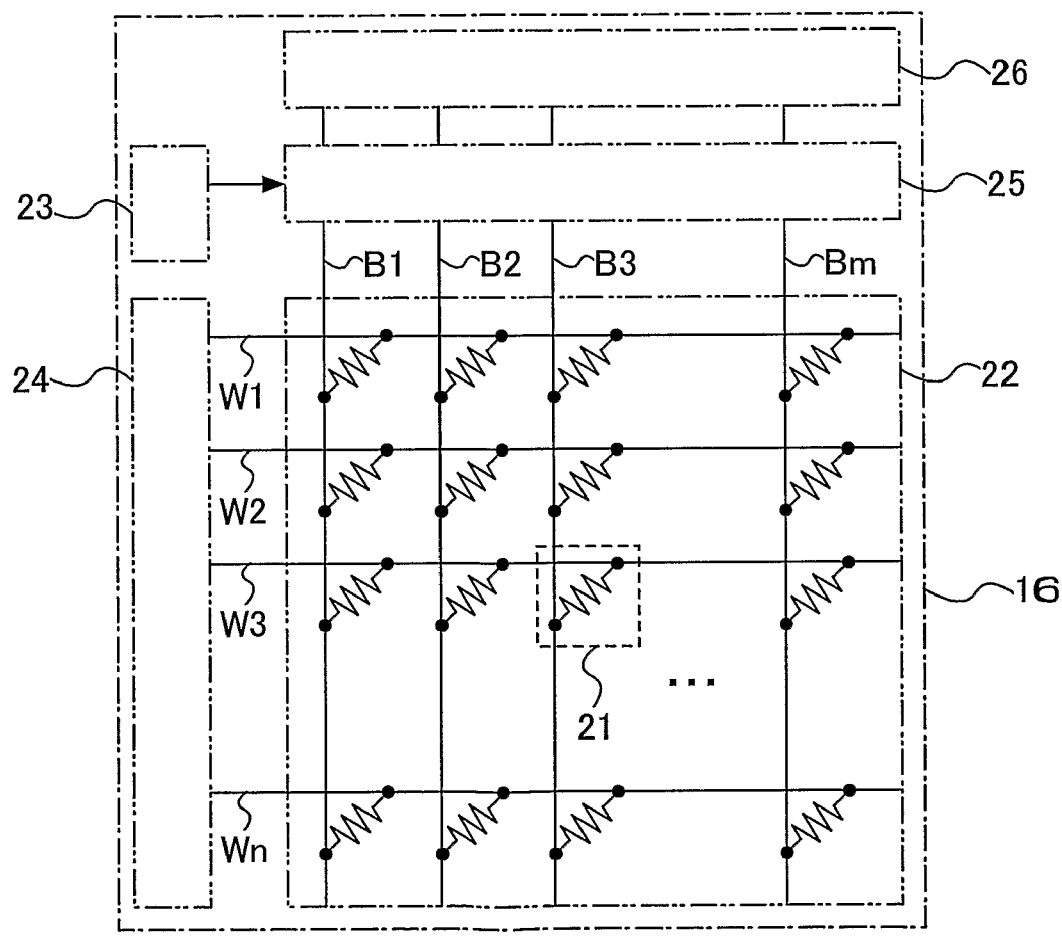
Figure 2A:
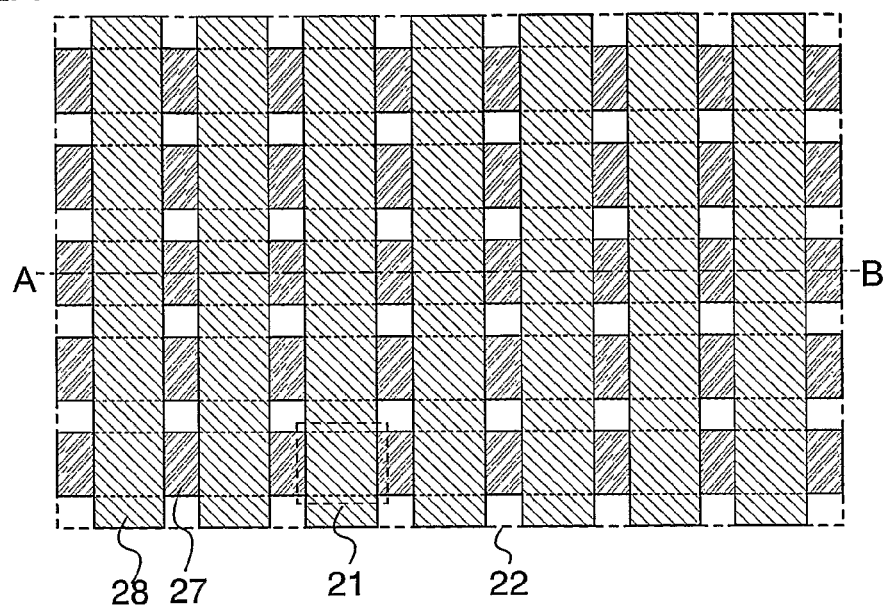
FIGS. 2A to 2D are diagrams showing the semiconductor device of the invention and a driving method thereof.
Figure 2B:
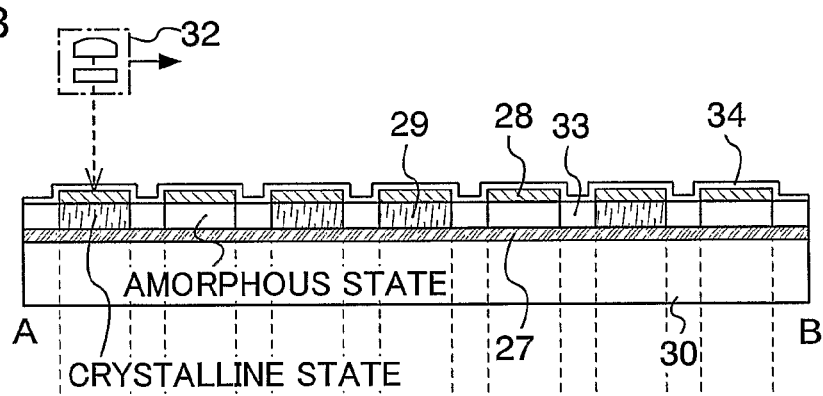
Figure 2C:
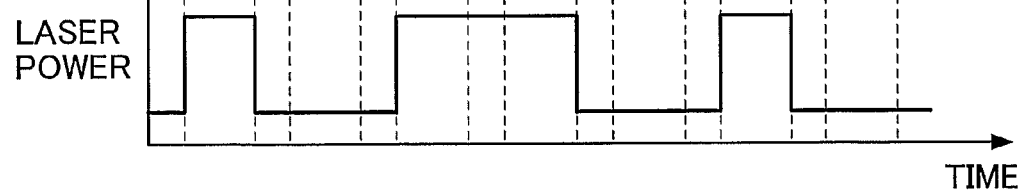
Figure 2D:
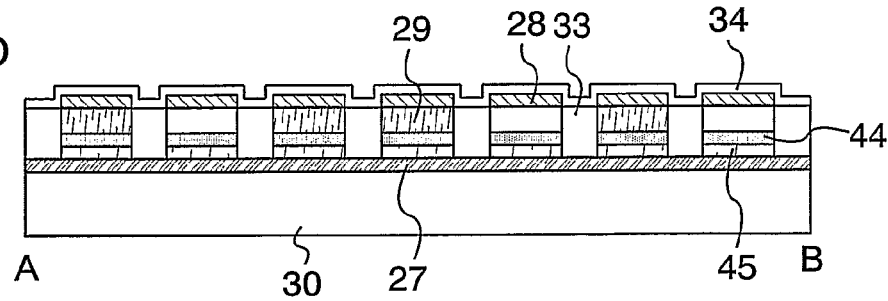
Figure 3A:
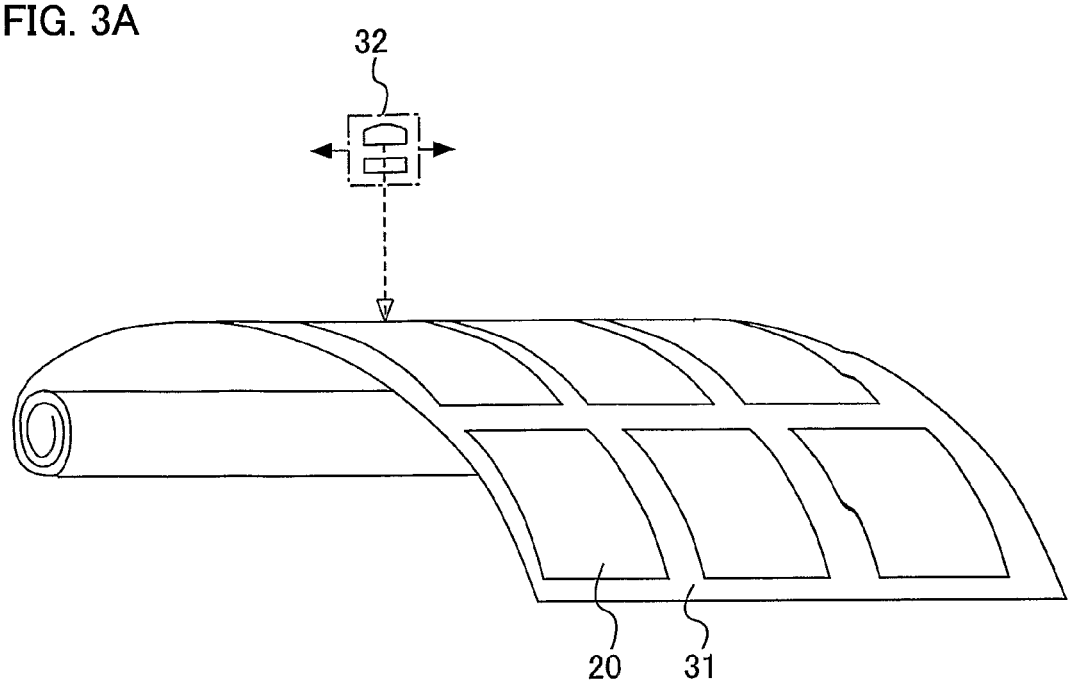
FIGS. 3A and 3B are diagrams showing the semiconductor device of the invention.

Data writing to the phase change memory included in the semiconductor device 20 of the invention is performed optically or electrically. When writing data optically, a plurality of semiconductor devices 20 are formed over a flexible substrate 31 and irradiated with laser light by a laser light irradiating means 32, thus data can be continuously written easily. Moreover, by employing such a manufacturing process, the semiconductor device 20 can be easily manufactured at a large quantity (see FIG. 3A). Accordingly, the inexpensive semiconductor device 20 can be provided.

Figure 3B:
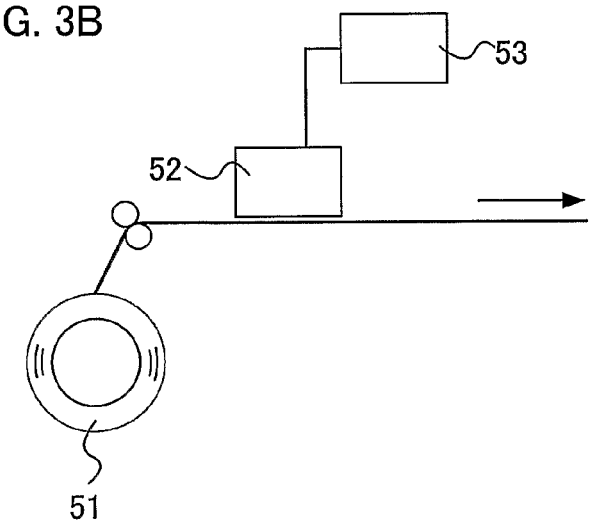

The phase change layer of the phase change memory becomes a first state (for example, an amorphous state) when heated to a fusing temperature or higher to be fused and a second state (for example, a crystalline state) when heated to a crystallizing temperature or higher. That is to say, data writing can be performed by a thermal process as well using different heating temperatures. Accordingly, a manufacturing process using different heating temperatures may be employed as well. For example, a roll 51 comprises the flexible substrate 31 in which a plurality of semiconductor devices are formed (see FIG. 3B). Then, data may be written to the semiconductor devices by thermal process using different temperatures by a heating means 52. The heating means 52 is controlled by a control means 53.

Embodiment 2

Figure 4A:
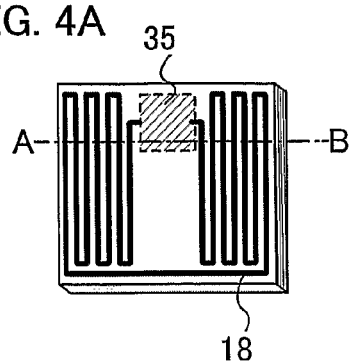
FIGS. 4A to 4D are diagrams showing examples of manufacturing steps of the semiconductor device of the invention.
Figure 4B:
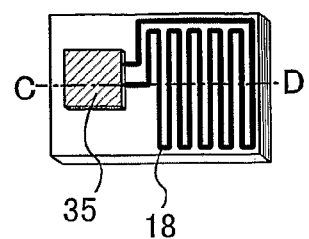
Figure 4C:
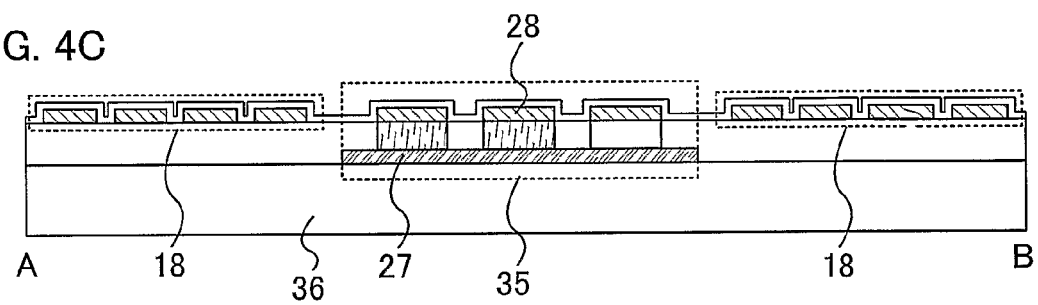
Figure 4D:
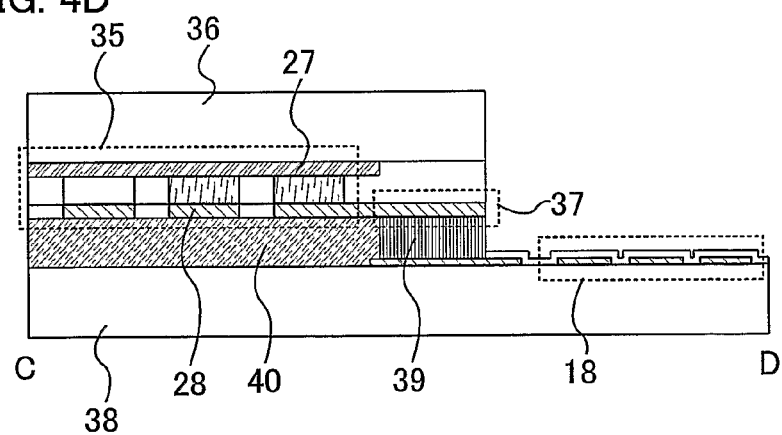

According to the semiconductor device of the intention, data can be read and written without contact. The major data transmission methods are an electromagnetic coupling method that a pair of coils are provided to be opposed and data is communicated by mutual induction, an electromagnetic induction method that data is communicated by inductive electromagnetic field, and an electric wave method that data is communicated using an electric wave, and any of these methods may be employed. The antenna 18 used for transmitting data is provided in two ways. One way is to provide the antenna 18 on a substrate 36 over which a plurality of elements are formed (see FIGS. 4A and 4C) and the other way is to provide the antenna 18 so as to be connected to a terminal portion 37 that is provided on the substrate 36 over which a plurality of elements are formed (see FIGS. 4B and 4D). Here, a plurality of elements provided over the substrate 36 are referred to as an element group 35.

In the case of the former structure (FIGS. 4A and 4C), the element group 35 and a conductive layer that functions as the antenna 18 are provided over the substrate 36. In the shown structure, a conductive layer that functions as the antenna 18 is provided in the same layer as the second conductive layer 28. However, the invention is not limited to the aforementioned structure and the antenna 18 may be provided in the same layer as the first conductive layer 27. Alternatively, an insulating film may be provided so as to cover the element group 35 and the antenna 18 may be provided over the insulating film.

In the latter structure (FIGS. 4B and 4D), the element group 35 and the terminal portion 37 are provided over the substrate 36. In the shown structure, a conductive layer provided in the same layer as the second conductive layer 28 is used as the terminal portion 37. Then, a substrate 38 over which the antenna 18 is provided is attached so as to be connected to the terminal portion 37. A conductive particle 39 and a resin 40 are provided between the substrate 36 and the substrate 38.

Note that materials containing the conductive particle 39 and the resin 40 are referred to as anisotropic conductive materials.

The element group 35 can be provided inexpensively by forming a plurality of them over a large substrate and dividing them later. A substrate used at this time is a glass substrate, a flexible substrate and the like.

A plurality of transistors included in the element group 35 may be provided over a plurality of layers. That is to say, they may be formed on a plurality of layers, respectively. When forming the element group 35 over a plurality of layers, an interlayer insulating film is used. The interlayer insulating film is preferably formed of a resin material such as an epoxy resin and an acryl resin, a resin material such as a light transmitting polyimide resin, a compound material formed by copolymerizing siloxane polymers and the like, a material containing aqueous homopolymers and aqueous copolymers, and an inorganic material.

For the siloxane compound material, a material containing a bone structure of silicon and oxygen bond and at least hydrogen as a substituent, or a material containing at least one of fluoride, alkyl group, and aromatic hydrocarbon as a substituent.

For the interlayer insulating film, a material having low dielectric constant is preferably used for decreasing parasitic capacitance that generates between the layers. The parasitic capacitance being decreased, a high speed operation can be realized as well as low power consumption can be achieved.

The plurality of transistors included in the element group 35 may have an active layer formed of any of an amorphous semiconductor, a microcrystalline semiconductor, a polycrystalline semiconductor, an organic semiconductor and the like, however, it is preferable to use an active layer crystallized using a metal element as a catalyst and a semiconductor crystallized by laser irradiation in order to obtain a transistor having favorable characteristics. Further, it is preferable to use as an active layer a semiconductor layer formed by plasma CVD using a $SiH_4/F_2$ gas or a $SiH_4/H_2$ gas (Ar gas) and that semiconductor layer irradiated with laser.

The plurality of transistors included in the element group 35 can be formed by using a crystalline semiconductor layer (a low temperature polysilicon layer) crystallized at a temperature of 200 to 600° C. (preferably 350 to 500° C.) and a crystalline semiconductor layer (a high temperature polysilicon layer) crystallized at a temperature of 600° C. or higher. When forming a high temperature polysilicon layer over a substrate, a quartz substrate is preferably used since a glass substrate is sensitive to heat.

It is preferable to add hydrogen or halogen impurity elements to the active layer (a channel forming region in particular) of the transistor included in the element group 35 at a concentration of $1\times10^{19}$ to $1\times10^{22}$ atoms/cm$^3$ (preferably at a concentration of $1\times10^{19}$ to $5\times10^{20}$ atoms/cm$^3$). Then, an active layer having few defects and hardly generates a crack can be obtained.

It is preferable to provide a barrier film that blocks contaminants such as an alkaline metal so as to wrap the transistor included in the element group 35 or the element group 35 itself. Then, the element group 35 of which reliability is improved without being contaminated can be provided. For the barrier film, a silicon nitride film, a silicon nitride oxide film, a silicon oxynitride film or the like can be used.

The thickness of the active layer of the transistor included in the element group 35 is preferably 20 to 200 nm, more preferably 40 to 170 nm, and even more preferably 45 to 55 nm and 145 to 155 nm, and most preferably 50 nm and 150 nm. Then, the element group 35 that hardly generates a crack even when it is bent can be provided.

It is preferable to form crystals that form the active layer of the transistor included in the element group 35 so as to include a crystal boundary that extends in parallel to a direction of carrier flow (a channel length direction). Such an active layer is preferably formed using a continuous oscillation laser (abbreviated as CWLC) or a pulsed laser that operates at a frequency of 10 MHz or higher, or preferably 60 to 100 MHz.

It is preferable that the transistor included in the element group 35 have an S value (a sub-threshold value) of 0.35 V/decade or less (preferably 0.09 to 0.25 V/decade), and mobility of 10 cm$^2$/Vs or more. Such characteristics can be achieved by forming the active layer using a continuous oscillation laser and a pulsed laser that operates at a frequency of 10 MHz or higher.

The element group 35 has characteristics of 1 MHz (preferably 10 MHz or higher) or higher measured by a ring oscillator (at 3 to 5 V). Alternatively, a frequency characteristic per gate is preferably 100 kHz or higher, and preferably 1 MHz or higher (at 3 to 5 V).

That is to say, the element group 35 has a delay time of 1 μsec or less (preferably 100 nsec or less) per stage of gate of the ring oscillator (at 3 to 5 V).

The antenna 18 is preferably formed by a droplet discharging method using a conductive paste containing nano-particles of gold, silver, copper and the like. The droplet discharging method is a generic term for a method that a pattern is formed by discharging droplets such as an ink-jet method and a dispenser method. The droplet discharging method is advantageous in various aspects such that the material can be used efficiently.

Figure 5A:
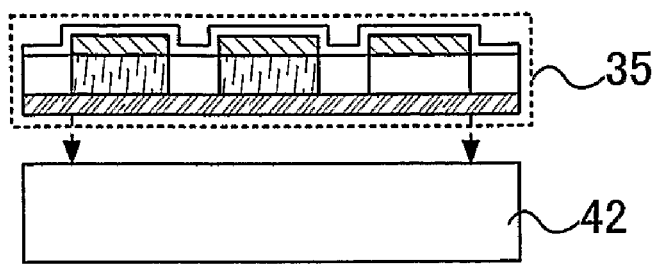
FIGS. 5A to 5D are diagrams showing the semiconductor device of the invention.
Figure 5B:
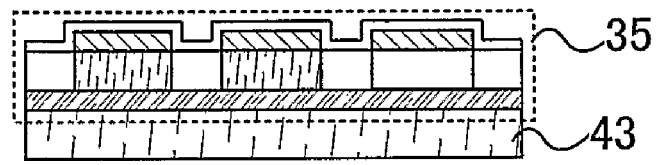

A substrate 42 on which the element group 35 is formed may be used as it is, but the element group 35 over the substrate 42 may be peeled off (see FIG. 5A) and attached to a flexible substrate 43 (see FIG. 5B).

The element group 35 can be peeled off the substrate 42 by (1) a method of: providing a metal oxide film between the substrate 42 of high heat resistance and the element group 35; and weakening the metal oxide film by crystallization, (2) a method of: providing an amorphous silicon film containing hydrogen between the substrate 42 of high heat resistance and the element group 35; and removing the amorphous silicon film by laser light irradiation or etching, or (3) a method of removing the substrate 42 of high heat resistance over which the element group 35 is formed, mechanically or by etching using a solution or a gas such as $ClF_3$. The peeled element group 35 may be attached to the flexible substrate 43 using a commercial adhesive such as an epoxy resin adhesive and an adhesive using a resin additive.

Also, the element group 35 can be peeled off the substrate 42 by providing a peeling layer between the substrate 42 and the element group 35 in advance and removing the peeling layer using an etchant, or by removing the peeling layer partially using an etchant and then peeling off the element group 35 and the substrate 42 physically. Note that peeling physically means peeling by an external stress. The external stress corresponds to a wind pressure blown from a nozzle, supersonic waves, or the like.

Figure 5C:
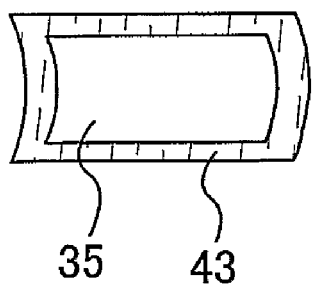
Figure 5D:
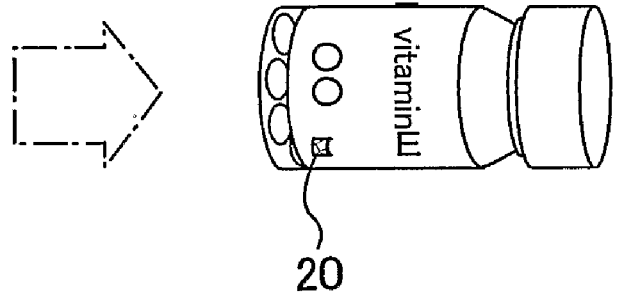

As described above, by attaching the element group 35 to the substrate 43, a semiconductor device which is thin, lightweight, and is not easily broken when dropped can be provided. Also, the flexible substrate 43 has flexibility, therefore, it can be attached onto a curved or odd-shaped surface, which realizes various applications. For example, a wireless tag that is one mode of the semiconductor device 20 of the invention can be closely attached to a curved surface such as a medicine bottle (see FIGS. 5C and 5D). Moreover, by reusing the substrate 42, an inexpensive semiconductor device can be provided. This embodiment can be freely implemented in combination with the aforementioned embodiment mode and embodiments.

Embodiment 3

Figure 6A:
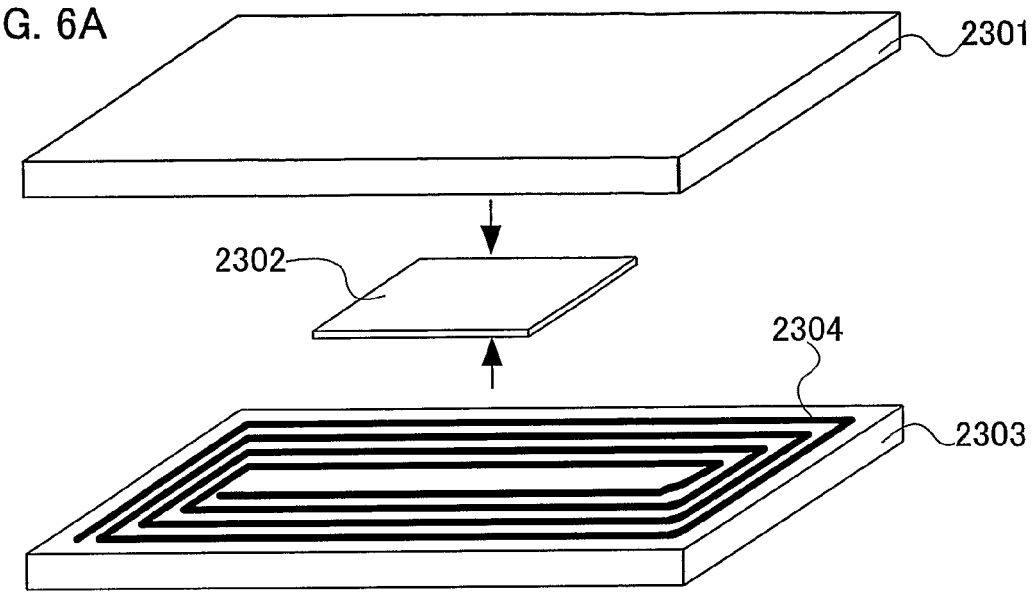
FIGS. 6A to 6C are diagrams showing the semiconductor device of the invention.

In this embodiment, description is made on the case of forming a flexible wireless tag using a peeling process (see FIG. 6A). A wireless tag includes a flexible protective layer 2301, a flexible protective layer 2303 including an antenna 2304, and an element group 2302 formed by a peeling process. The antenna 2304 formed over the protective layer 2303 is electrically connected to the element group 2302. In the shown structure, the antenna 2304 is formed only over the protective layer 2303, however, the invention is not limited to this structure and the antenna 2304 may be formed over the protective layer 2301 as well. It is to be noted that a barrier film formed of a silicon nitride film is preferably formed between the element group 2302 and the protective layers 2301 and 2303. Then, a wireless tag of which reliability is improved without contaminating the element group 2302 can be provided.

It is preferable that the antenna 2304 is formed of silver, copper, or a metal plated with them. The element group 2302 and the antenna 2304 are connected by performing UV treatment or supersonic treatment using an anisotropic conductive film, however, the invention is not limited to this method and various methods can be employed as well.

Figure 6B:
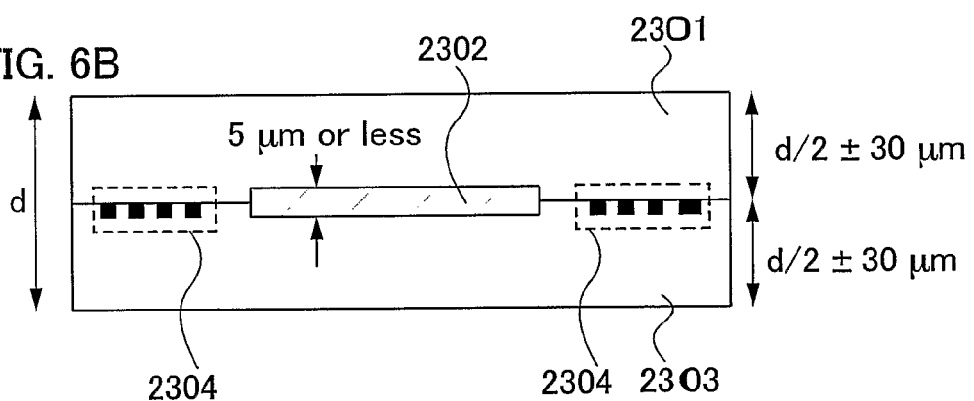

It is preferable to form the element group 2302 sandwiched between the protective layers 2301 and 2303 so as to be in thickness of 5 μm or less, or preferably 0.1 to 3 μm (see FIG. 6B for a sectional structure thereof). When a thickness of the stacked protective layers 2301 and 2303 is d, the thickness of each of the protective layers 2301 and 2303 is preferably (d/2) ±30 μm, and more preferably (d/2) ±10 μm. It is preferable that the thickness of each of the protective layers 2301 and 2303 is 10 to 200 μm. Moreover, the element group 2302 may have an area of 5 mm square (25 $mm^2$) or less, and preferably 0.3 to 4 mm square (0.09 to 16 $mm^2$).

Since the protective layers 2301 and 2303 are each formed of an organic resin material, they are highly resistant to bending. The element group 2302 itself formed by a peeling process is also highly resistant to bending as compared to a single crystalline semiconductor. The element group 2302 and the protective layers 2301 and 2303 can be closely attached to each other without any space, therefore a completed wireless tag itself is also highly resistant to bending. The element group 2302 surrounded by such protective layers 2301 and 2303 may be disposed over or inside other objects or implanted in paper as well.

Figure 6C:
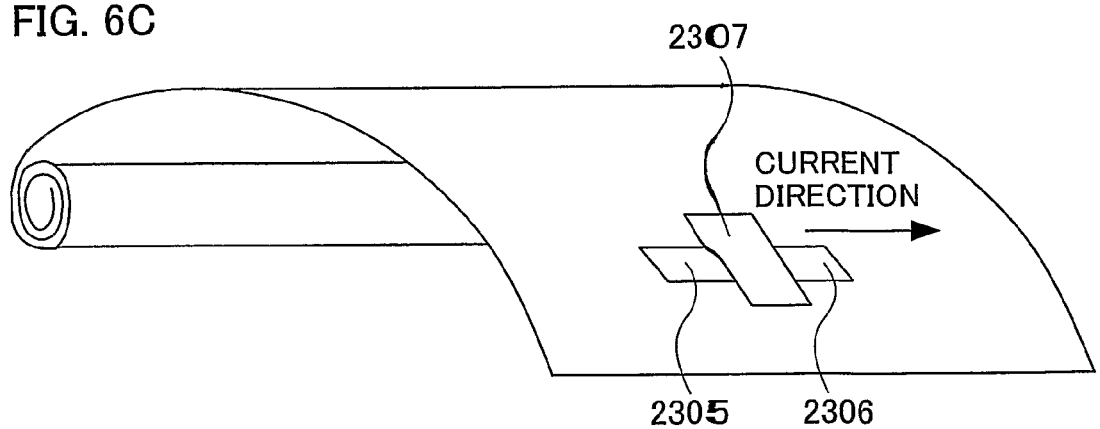

Now, description is made on the case of attaching the element group formed by a peeling process to a curved substrate (see FIG. 6C). In the drawing, one transistor selected from the element group formed by a peeling process is shown. This transistor is formed linearly in a direction of current flow. In other words, this transistor is disposed so that the direction of current flow and a direction of the arc of the substrate become perpendicular to each other. That is, a drain electrode 2305, a gate electrode 2307, and a source electrode 2306 are formed linearly. Then, the direction of current flow and the direction of the arc of the substrate are disposed perpendicularly. With such a disposition, stress applied when the substrate is bent in an arc does not affect much and a variation in characteristics of the transistors included in the element group can be suppressed.

In order to prevent active elements such as a transistor from being broken due to the stress, it is preferable to form an active region (a silicon island portion) of the active element so as to occupy 5 to 50% (preferably 5 to 30%) of the entire area of the substrate. In a region where the active element such as a TFT is not provided, a base insulating film material, an interlayer insulating film material and a wiring material are mainly provided. It is preferable that the area other than the active region such as a transistor be 60% or more of the entire substrate area. Accordingly, a highly integrated semiconductor device that can be easily bent can be provided. This embodiment can be freely implemented in combination with the aforementioned embodiment modes and embodiments.

Embodiment 4

The application range of the semiconductor device of the invention is wide. For example, a wireless tag as one mode of the semiconductor device 20 of the invention can be provided for a bill, a coin, securities, a certificate, a bearer bond, a packaging container, a book, a memory medium, personal belongings, a vehicle, groceries, a garment, a health product, a daily commodity, a medicine, an electronic device and the like.

Figure 7A:
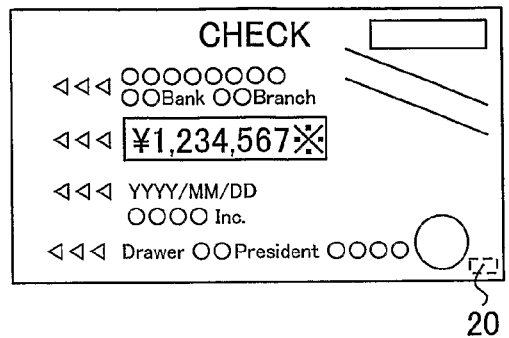
FIGS. 7A to 7H are diagrams showing applications of the semiconductor device of the invention.
Figure 7B:
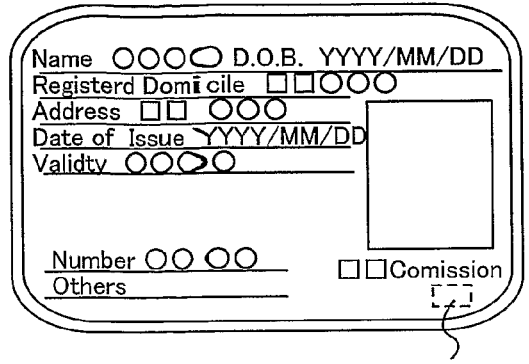
Figure 7C:
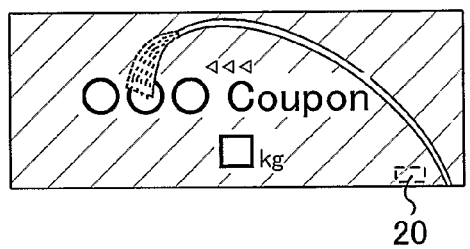
Figure 7D:
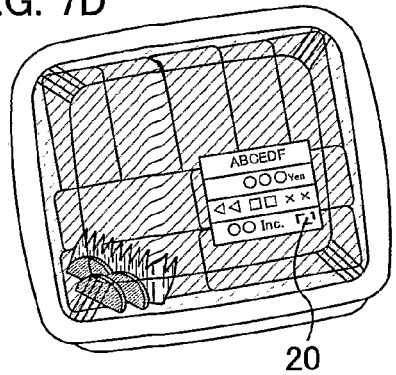
Figure 7E:
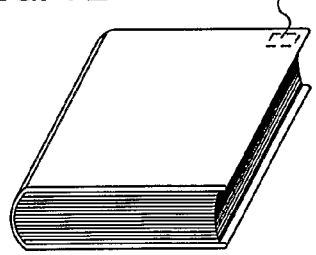
Figure 7F:
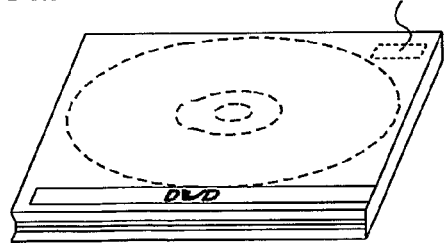
Figure 7G:
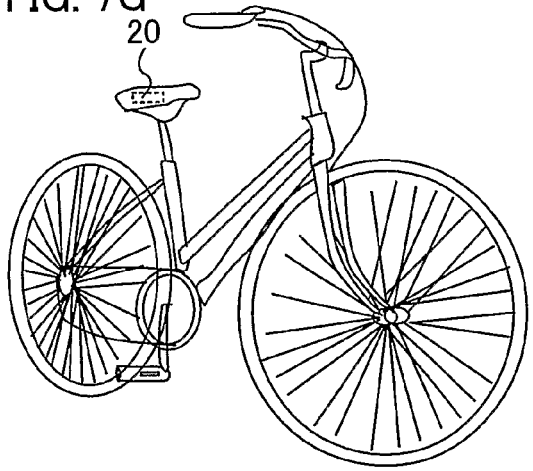
Figure 7H:

The bill and coin are money that circulate in the market, including the ones that can be used in the same way as money in a specific area (cash voucher), a commemorative coin and the like. The securities include a check, a certificate, a promissory note and the like (see FIG. 7A). The certificate includes a driver's license, a resident's card and the like (see FIG. 7B). The bearer bond includes a stamp, various gift certificates and the like (see FIG. 7C). The packaging container includes a packaging paper of a packed lunch, a plastic bottle and the like (see FIG. 7D). The book includes a magazine, a dictionary and the like (see FIG. 7E). The memory medium corresponds to a DVD software, a video tape and the like (see FIG. 7F). The vehicle corresponds to a wheeled vehicle such as a bicycle, a ship and the like (see FIG. 7G). The personal belongings correspond to a bag, glasses, and the like (see FIG. 7H). The groceries correspond to foods, beverages and the like. The garment corresponds to clothes, shoes and the like. The health product corresponds to a medical apparatus, a health appliance and the like. The daily commodity corresponds to furniture, lightings and the like. The medicine corresponds to a drug, an agricultural chemical and the like. The electronic device corresponds to a liquid crystal display device, an EL display device, a television set (a television receiver, a thin television receiver, a thin television set), a portable phone and the like.

By providing a wireless tag for a bill, a coin, securities, a certificate, a bearer bond and the like, forgery can be prevented. Moreover, by providing a wireless tag for a packaging container, a book, a memory medium, personal belongings, groceries, a daily commodity, an electronic device and the like, an inspection system and a system of a rental store and the like can be facilitated. By providing a wireless tag for a vehicle, a health product, a medicine and the like, forgery or stealing can be prevented and medication error can be prevented in the case of the medicine. The wireless tag can be provided by attaching it to the surface of the object or implanting it. For example, the wireless tag can be implanted in paper in the case of a book and can be implanted in an organic resin in the case of a package formed of the organic resin.

Figure 8A:
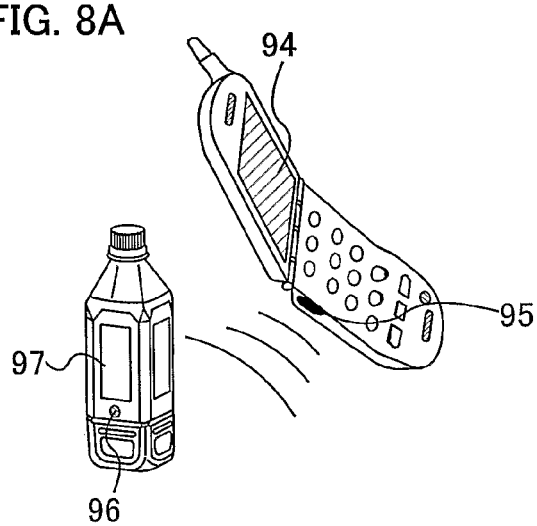
FIGS. 8A and 8B are diagrams showing applications of the semiconductor device of the invention.
Figure 8B:
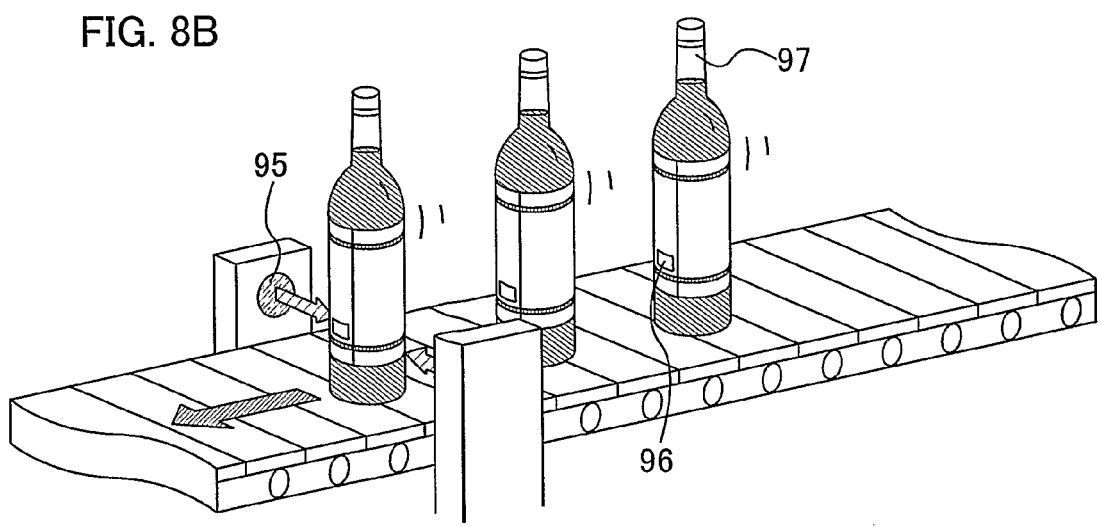
Figure 9:
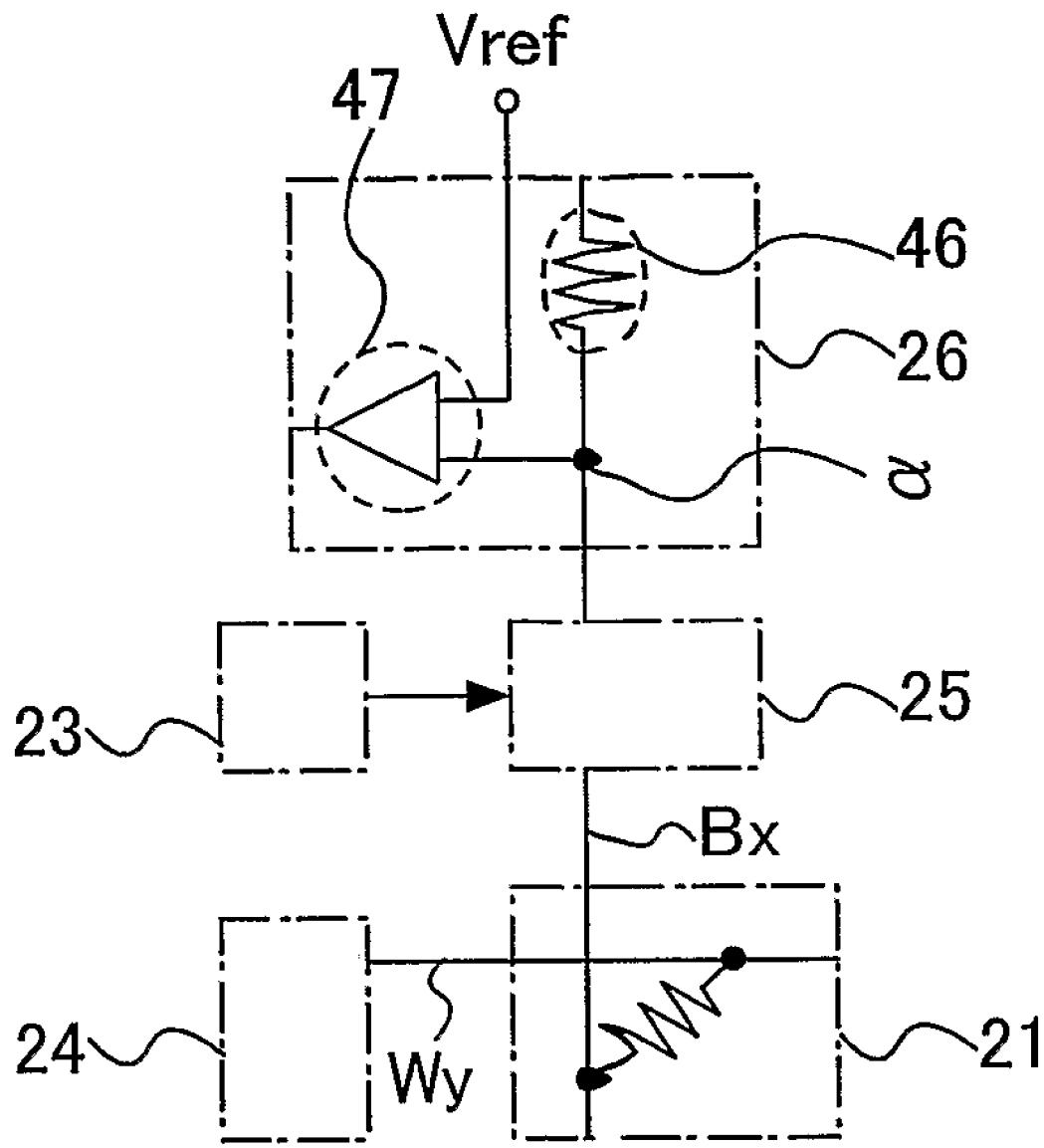
FIG. 9 is a diagram showing the semiconductor device of the invention and a driving method thereof.

By applying a wireless tag to management of objects and circulation system, a high functional system can be obtained. For example, a reader/writer 95 is provided on a side of a portable terminal including a display portion 94, and a wireless tag 96 as one mode of the semiconductor device of the invention is provided on a side of a product 97 (see FIG. 8A). In this case, by exposing the wireless tag 96 to the reader/writer 95, data of the product 97 such as a primary material, a country of origin, and a history of circulation are displayed on the display portion 94. In a conventional technique, the data of the product 97 is all described on a label, however, more data can be provided by providing the wireless tag 96. Further, as another example, the reader/writer 95 is provided on the sides of a conveyor belt (see FIG. 8B). In this case, inspection of the product 97 can be easily performed. This embodiment can be freely implemented in combination with the aforementioned embodiment mode and embodiments.

Embodiment 5

A sectional structure of the semiconductor device of the invention is described with reference to FIGS. 10A and 10B. The semiconductor device of the invention includes an element group 102 provided over a substrate 101, a phase change memory 104 and a conductive layer 105 that functions as an antenna. In this manner, a semiconductor device in which the element group 102, the phase change memory 104, and the conductive layer 105 that functions as an antenna are integrally formed on the substrate 101 having an insulating surface can be formed in a small size, thin design, and lightweight. The element group 102 includes a plurality of elements such as a transistor, a capacitor and a resistor, which form a power source circuit, a clock generating circuit and the like. The phase change memory 104 includes a plurality of stacks of a conductive layer 111, a phase change layer 112, and a conductive layer 113. The stack of the conductive layer 111, the phase change layer 112, and the conductive layer 113 is sometimes referred to as a memory element 114.

Figure 10A:
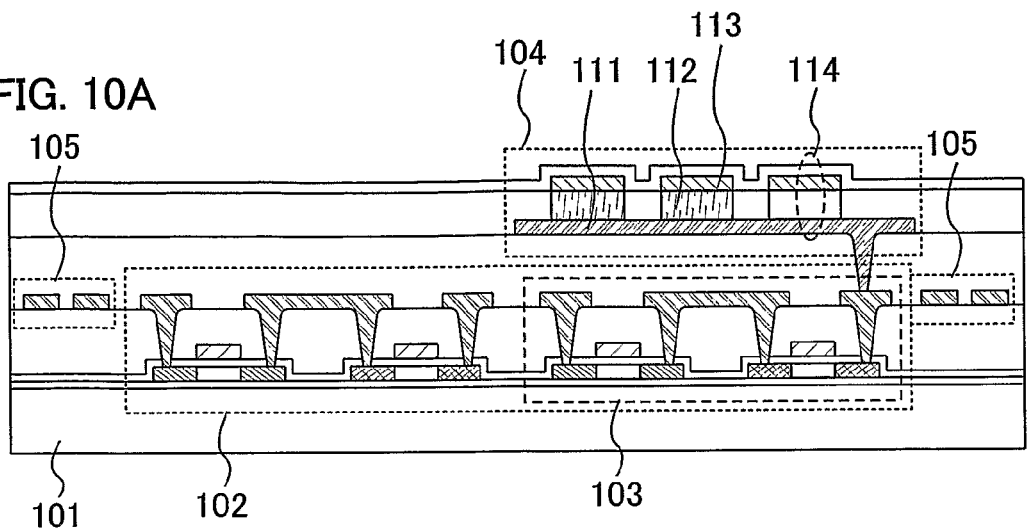
FIGS. 10A and 10B are diagrams showing the semiconductor device of the invention.
Figure 10B:
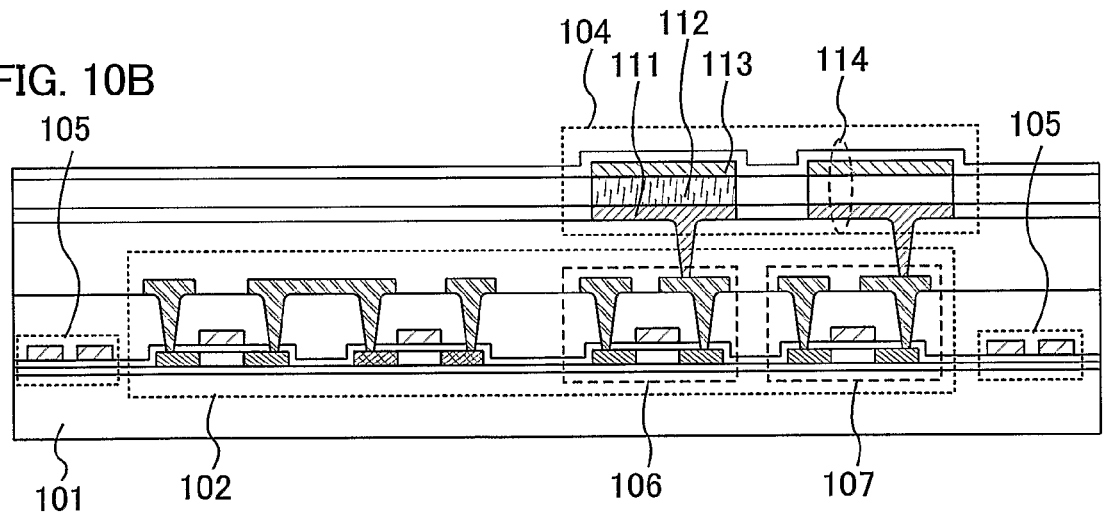

Note that FIGS. 10A and 10B show a plurality of transistors as the element group 102. In FIG. 10A, the element group 102 includes a CMOS circuit 103 which controls an operation of the phase change memory 104. In FIG. 10B, the element group 102 includes transistors 106 and 107 each of which controls an operation of the memory element 114.

The invention claimed is:

1. A semiconductor device comprising:
a phase change memory over a glass substrate;
an antenna transforming electromagnetic waves into AC electrical signals; and
a power supply circuit for generating power supply voltage based on the AC electrical signal which is supplied from the antenna,
wherein the phase change memory includes a plurality of bit lines that extend in a first direction, word lines that extend in a second direction perpendicular to the first direction, and phase change layers provided between the bit lines and the word lines, and
wherein at least one of the bit lines and the word lines transmits light.

2. A semiconductor device comprising:
a phase change memory;
an antenna transforming electromagnetic waves into AC electrical signals; and
a power supply circuit for generating power supply voltage based on the AC electrical signal which is supplied from the antenna,
wherein the phase change memory includes a plurality of bit lines that extend in a first direction, word lines that extend in a second direction perpendicular to the first direction, and phase change layers provided between the bit lines and the word lines; and
wherein at least one of the bit lines and the word lines transmits light.

3. The semiconductor device according to claim 2, wherein the phase change memory is provided on a glass substrate.

4. The semiconductor device according to claim 2, wherein the phase change memory is provided on a flexible substrate.

5. The semiconductor device according to claim 1 or 2, wherein the phase change layer includes a material that changes reversibly between a crystalline state and an amorphous state.

6. The semiconductor device according to claim 1 or 2, wherein the phase change layer includes a material that changes reversibly between a first crystalline state and a second crystalline state.

7. The semiconductor device according to claim 1 or 2, wherein the phase change layer includes a material that changes only from an amorphous state to a crystalline state.

8. The semiconductor device according to claim 1 or 2, wherein the phase change layer includes a plurality selected from germanium (Ge), tellurium (Te), antimony (Sb), sulfur (S), tellurium oxide (TeOx), tin (Sn), gold (Au), gallium (Ga), selenium (Se), indium (In), thallium (Tl), cobalt (Co), and silver (Ag).

9. The semiconductor device according to claim 1 or 2, wherein the phase change layer includes a plurality selected from silver (Ag), zinc (Zn), copper (Cu), aluminum (Al), nickel (Ni), indium (In), antimony (Sb), selenium (Se), and tellurium (Te).

10. The semiconductor device according to claim 1 or 2, wherein the phase change layer includes a plurality selected from tellurium (Te), tellurium oxide (TeOx), palladium (Pd), antimony (Sb), selenium (Se), and bismuth (Bi).

11. The semiconductor device according to claim 1 or 2, wherein the semiconductor device includes one or a plurality selected from a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory.

12. The semiconductor device according to claim 1 or 2, wherein the semiconductor device includes one or a plurality of a clock generating circuit, a data demodulation/modulation circuit, and an interface circuit.

13. The semiconductor device according to claim 1 or 2,
wherein the semiconductor device includes a control circuit that controls the phase change memory; and
wherein the control circuit includes a thin film transistor.

14. A semiconductor device comprising:
a phase change memory formed over a glass substrate;
a control circuit including a thin film transistor formed over the glass substrate, which controls the phase change memory;
an antenna transforming electromagnetic waves into AC electrical signals; and
a power supply circuit for generating power supply voltage based on the AC electrical signal which is supplied from the antenna,
wherein the phase change memory includes a plurality of bit lines that extend in a first direction, word lines that extend in a second direction perpendicular to the first direction, and phase change layers provided between the bit lines and the word lines, and
wherein at least one of the bit lines and the word lines transmits light.

15. A semiconductor device comprising:
a phase change memory formed over a flexible substrate;
a control circuit including a thin film transistor formed over the flexible substrate, which controls the phase change memory;
an antenna transforming electromagnetic waves into AC electrical signals; and
a power supply circuit for generating power supply voltage based on the AC electrical signal which is supplied from the antenna,
wherein the phase change memory includes a plurality of bit lines that extend in a first direction, word lines that extend in a second direction perpendicular to the first direction, and phase change layers provided between the bit lines and the word lines,
wherein at least one of the bit lines and the word lines transmits light.

16. The semiconductor device according to claim 14 or 15, wherein the phase change layer includes a material that changes reversibly between a crystalline state and an amorphous state.

17. The semiconductor device according to claim 14 or 15, wherein the phase change layer includes a material that changes reversibly between a first crystalline state and a second crystalline state.

18. The semiconductor device according to claim 14 or 15 wherein the phase change layer includes a material that changes only from an amorphous state to a crystalline state.

19. The semiconductor device according to claim 14 or 15, wherein the phase change layer includes a plurality selected from germanium (Ge), tellurium (Te), antimony (Sb), sulfur (S), tellurium oxide (TeOx), tin (Sn), gold (Au), gallium (Ga), selenium (Se), indium (In), thallium (Tl), cobalt (Co), and silver (Ag).

20. The semiconductor device according to claim 14 or 15, wherein the phase change layer includes a plurality selected from silver (Ag), zinc (Zn), copper (Cu), aluminum (Al), nickel (Ni), indium (In), antimony (Sb), selenium (Se), and tellurium (Te).

21. The semiconductor device according to claim 14 or 15, wherein the phase change layer includes a plurality selected from tellurium (Te), tellurium oxide (TeOx), palladium (Pd), antimony (Sb), selenium (Se), and bismuth (Bi).

22. The semiconductor device according to claim 14 or 15, wherein the semiconductor device includes one or a plurality selected from a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory.

23. The semiconductor device according to claim 14 or 15, wherein the semiconductor device includes one or a plurality of a clock generating circuit, a data demodulation/modulation circuit, and an interface circuit.

* * * * *